United States Patent
Ahn et al.

(10) Patent No.: US 6,362,060 B2
(45) Date of Patent: Mar. 26, 2002

(54) METHOD FOR FORMING SEMICONDUCTOR DEVICE HAVING A GATE IN THE TRENCH

(75) Inventors: Jae-Gyung Ahn, Chungcheongbuk-do; Jeong-Hwan Son, Daejeon, both of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/879,200

(22) Filed: Jun. 13, 2001

Related U.S. Application Data

(62) Division of application No. 09/201,905, filed on Nov. 30, 1998, now Pat. No. 6,261,910, which is a division of application No. 08/853,505, filed on May 8, 1997, now Pat. No. 5,877,532.

(30) Foreign Application Priority Data

Jul. 29, 1996 (KR) ............................................. 96-3946

(51) Int. Cl.$^7$ ............................................ H01L 21/336
(52) U.S. Cl. ...................... 438/299; 438/270; 438/303; 438/305; 438/286; 438/589; 438/595
(58) Field of Search ................................. 438/179, 259, 438/263, 264, 270, 286, 301, 303, 305, 306, 519, 589, 594, 595, 299

(56) References Cited

U.S. PATENT DOCUMENTS

| | | | |
|---|---|---|---|
| 4,532,698 A | * 8/1985 | Fang et al. | 438/286 |
| 4,649,638 A | 3/1987 | Fang et al. | 29/590 |
| 5,180,680 A | * 1/1993 | Yang | 438/259 |
| 5,302,843 A | 4/1994 | Yamazaki | 257/296 |
| 5,466,961 A | 11/1995 | Kikuchi et al. | 257/379 |
| 5,502,321 A | 3/1996 | Matsushita | 257/316 |
| 5,554,550 A | 9/1996 | Yang | 438/259 |
| 5,716,865 A | 2/1998 | Ahn | 438/264 |
| 5,773,343 A | 6/1998 | Lee et al. | 438/259 |
| 5,998,288 A | 12/1999 | Gardner et al. | 438/589 |

* cited by examiner

Primary Examiner—Charles Bowers
Assistant Examiner—Jack Chen
(74) Attorney, Agent, or Firm—Fleshner & Kim, LLP

(57) ABSTRACT

A trench or a recess is formed in a predetermined part of a semiconductor substrate. Then, on the side of the trench or recess, a gate with a sidewall is formed by respective etching-back processes. Using the gate as a mask, a low concentration region for the LDD structure is formed. Using the gate and sidewall as a mask, a source region and a drain region are formed. Thus, the channel region makes a right angle with the trench or recess, and the channel region is bent. Further, the channel region is made to be formed so as to be longer than the width of the gate. Since the low concentration region for the LDD structure is formed only in the drain region, the source resistance can be decreased, and a gate with a narrow width can be easily formed. Further, even if the channel length is short, the occurrence of the DIBL phenomenon can be suppressed.

18 Claims, 4 Drawing Sheets

FIG5.D

METHOD FOR FORMING SEMICONDUCTOR DEVICE HAVING A GATE IN THE TRENCH

CROSS-REFERENCE TO RELATED APPLICATIONS

This application is a Divisional of U.S. patent application Ser. No. 09/201,905, filed Nov. 30,1998, now U.S. Pat. No. 6,261,910, which is a Divisional of U.S. patent application Ser. No. 08/853,505, filed May 8, 1997 (now U.S. Pat. No. 5,877,532), both of which are hereby incorporated by reference herein in their entirety.

BACKGROUND OF THE INVENTION

1. Field of the Invention

The present invention relates to a semiconductor device and a method of manufacturing the same, and more particularly, to a semiconductor device and a method of manufacturing the same in which one of the electrode region is formed in a recess or a trench of a substrate.

2. Background of the Related Art

As the integration of semiconductor devices increases, the width of a gate becomes narrower, and thus, the length of a channel shortens. Therefore, the electric field in the vicinity of a drain is increased to accelerate carriers of the channel region in a depletion layer near the drain during the operation of a device, thereby causing a hot-carrier effect of injecting the carriers into a gate oxide film. The carriers injected into the gate oxide film create static charges in the interface between a semiconductor substrate and the gate oxide film, thereby varying a threshold voltage ($V_{TH}$), or reducing a mutual inductance to deteriorate the device characteristics. Accordingly, in order to decrease the degradation of the device characteristics caused by the hot-carrier effect, a lightly doped drain (LDD) structure is used.

FIG. 1 is a cross-sectional view of a related art semiconductor device in which, on a predetermined part of a P-type semiconductor substrate 11, a device isolation region 13 for defining an active region of the device is formed by a local oxidation of silicon (LOCOS) method. A gate 17 is formed on a predetermined part of the active region of semiconductor substrate 11, with a gate insulating film 15 imposed therebetween. A capping oxide film 19 is formed on gate 17. A sidewall 23 is formed on the sides of both gate 17 and capping oxide film 19.

The semiconductor substrate 11 is doped on both sides of gate 17 with a low concentration of N-type impurity, thereby forming a low concentration region 21 for the LDD structure. Further, the semiconductor substrate is doped with a high concentration of N-type impurity so as to be partially overlapped with low concentration region 21, thereby forming source and drain regions 25 and 27, respectively. Source and drain regions 25 and 27 are formed using capping oxide film 19 and sidewall 23 as a mask. Low concentration region 21 is located between source and drain regions 25 and 27 and gate 17.

However, according to the aforementioned related art semiconductor device, low concentration region 21 for the LDD structure is formed in source region 25 as well as in drain region 27, so that the source resistance is increased thereby causing the current characteristics of the device to deteriorate. Further, if the bias of drain region 27 increases, a depletion region is increased, thereby causing a drain-induced barrier lowering (hereinafter, referred to as "DIBL") phenomenon that reduces the potential barrier of the source. In addition, due to the limitations of a photolithographic methods, reduction of the gate width is difficult.

SUMMARY OF THE INVENTION

An object of the invention is to solve at least the above problems and/or disadvantages and to provide at least the advantages described hereinafter.

An object of the present invention is to obviate one or more of the problems of the related art.

Another object of the present invention is to reduce the source resistance.

Another object of the present invention is to suppress the occurrence of the DIBL phenomenon even if the channel length is short.

A further object of the present invention is to provide a narrow gate.

To achieve these and other advantages and in accordance with the purpose of the present invention, as embodied and broadly described, a semiconductor device of the present invention comprises: a semiconductor substrate of a first conductivity type; a device isolation region formed on a predetermined part of the surface of the semiconductor substrate to define an active region of the device; a trench formed on a predetermined part of one side of the active region on the semiconductor substrate; a gate oxide film formed on predetermined parts of the side and the lower part of the trench; a gate formed such that the lower part and a first side thereof are in contact with the surface of the gate oxide film and the second side of the gate is exposed; a sidewall formed so as to be in contact with the second side of the gate; a low concentration region formed by doping an impurity of a second conductivity type opposite, to that of the semiconductor substrate, with a low concentration of dopant in the lower part of the sidewall; and source and drain regions formed by doping an impurity of the second conductivity type with a high concentration of dopant, using the gate and the sidewall as a mask.

In another aspect, the present invention provides a semiconductor device comprising: a semiconductor substrate of a first conductivity type; a device isolation region formed on a predetermined part of the surface of the semiconductor substrate to define an active region of the device; a trench formed on a predetermined part of one side of the active region on the semiconductor substrate; a gate oxide film formed on a predetermined part of the lower surface of the trench so as to be spaced apart from the side of the trench by a predetermined distance; a gate formed on the gate oxide film and having first and second sides; a low concentration region formed by doping an impurity of a second conductivity type, opposite to that of the semiconductor substrate, at a low concentration in the lower surface between the first side of the gate and the side of the trench; and source and drain regions formed by doping an impurity of the second conductivity type at a high concentration in a part of the semiconductor substrate in the direction of the first side of the gate not doped at a low concentration and a part of the semiconductor substrate in the direction of the second side of the gate.

In another aspect, the present invention provides a method of manufacturing a semiconductor device comprising the steps of: forming a trench in a predetermined part of one side of a semiconductor substrate of a first conductivity type; forming a gate oxide film on the surface of the semiconductor substrate including the inner surface of the trench; depositing a polycrystalline silicon material on the upper part of the gate oxide film and etching back the polycrystalline silicon material to form a gate such that the first side thereof is in contact with the side of the trench and the second side of the gate is exposed; ion-implanting an impurity of a second conductivity type, opposite to that of the semiconductor substrate, using the gate as a mask to thereby form low concentration regions on both sides of the gate; forming a sidewall on the second side of the gate; and ion-implanting a high concentration of an impurity of the second conductivity type, using the gate and the sidewall as a mask, to thereby form source and drain regions in the semiconductor substrate in the direction of the first side of the gate and in the semiconductor substrate excluding the lower part of the sidewall in the direction of the second side of the gate.

In another aspect, the present invention provides a method of manufacturing a semiconductor device comprising the steps of: forming a trench in a predetermined part of one side of a semiconductor substrate of a first conductivity type; forming a gate oxide film on the surface of the semiconductor substrate including the inner surface of the trench; forming a sidewall such that a first side thereof is in contact with a side or inner wall of the trench and the second side of the sidewall is exposed, with the gate oxide film imposed between the side of the trench and the first side of the sidewall; forming a gate such that the first side thereof is in contact with the second side of the sidewall and the second side of the gate is exposed; ion-implanting a high concentration of an impurity having a second conductivity type, opposite to that of the semiconductor substrate, using the sidewall and the gate as a mask, to thereby form source and drain regions, respectively, in the directions of the first side and the second side of the gate excluding the lower part of the sidewall; removing the sidewall; and ion-implanting an impurity of the second conductivity type using the gate as a mask, to thereby form a low concentration region in the direction of the first side of the gate where the sidewall is removed.

The present invention may be achieved in part or in whole by a semiconductor device, comprising a semiconductor substrate of a first conductivity type; a recess formed in a surface of the semiconductor substrate; a first region of a second conductivity formed in the recess; a second region of the second conductivity formed on the surface of the semiconductor substrate; a gate formed in the recess, between the first and second regions, and insulated from the semiconductor substrate, first region and second region; and a channel formed between the first and second regions and beneath the gate in the semiconductor substrate.

The present invention may also be achieved in whole or in part by a semiconductor device comprising: a semiconductor substrate of a first conductivity type; a trench formed in a surface of the semiconductor substrate, the trench having a side wall surface and a lower surface; an insulating film formed on the sidewall and a prescribed area of the lower surface; a gate formed on the insulating film; a first doped region of a second conductivity formed in the trench; a second doped region of the second conductivity formed on the surface of the semiconductor substrate and adjacent to the insulating film on the sidewall of the trench; and a third doped region formed on the lower surface of the trench and between the gate and the first region; and a channel formed between the second and third regions.

The present invention may be achieved in whole or in part by a semiconductor substrate of a first conductivity type; a trench formed in a surface of the semiconductor substrate; a first doped region of a second conductivity formed in the trench; a second doped region of the second conductivity formed on the surface of the semiconductor substrate; a third doped region of the second conductivity formed adjacent to the second doped region; an insulating film formed between the first and third doped regions; a gate formed on the insulating film; and a channel formed between the first and third regions in the semiconductor substrate and beneath the insulating film.

To achieve at least the above objects and advantages in a whole or in parts and in accordance with the purpose of the present invention, as embodied and broadly described, a method of manufacturing a semiconductor device, including the steps of forming a trench in a top surface of a semiconductor substrate, wherein the trench comprises at least one vertical wall, implanting ions into the top surface of the semiconductor substrate and into a bottom surface of said trench, forming an oxide film on the top surface of the semiconductor substrate, on the at least one vertical wall and on the bottom surface of the trench, forming an oxide sidewall in the trench in contact with the oxide film on the at least one vertical wall and partially covering the bottom surface of the trench, forming a gate in the trench in contact with the oxide sidewall and partially covering the bottom surface of the trench, forming a first doped region in the top surface of the semiconductor substrate, forming a second doped region in the bottom surface of the trench, forming a recess by removing at least the oxide film on the at least one vertical wall and by removing at least the oxide sidewall, and forming a third doped region in the bottom of the recess.

To further achieve at least the above objects and advantages in a whole or in parts and in accordance with the purpose of the present invention, as embodied and broadly described, a method of manufacturing a semiconductor device, including the steps of forming a trench in a top surface of a semiconductor substrate with at least one sidewall, forming a gate oxide film over the semiconductor substrate so that the gate oxide film covers at least a portion of a bottom surface of the trench and covers the at least one sidewall of the trench, forming a gate on the gate oxide film on the bottom of the trench such that a first side of the gate is exposed and a second side of the gate contacts the gate oxide film covering the at least one sidewall of the trench and such that a top surface of the gate is at approximately the same height as the top surface of the semiconductor substrate, forming a first doped region having the first dopant concentration in the top surface of the substrate, forming a second doped region having a first dopant concentration on the bottom surface of the trench adjacent the exposed side of the gate, forming a recess between the gate and the at least one sidewall by removing at least the gate oxide film, and forming a third doped region at the bottom of the recess having a second dopant concentration.

To further achieve at least the above objects and advantages in a whole or in parts and in accordance with the purpose of the present invention, as embodied and broadly described, a method of manufacturing a semiconductor device, including the steps of forming a trench in a top surface of a semiconductor substrate, forming a gate oxide film on the surface of the semiconductor substrate so that the gate oxide film covers at least a portion of a bottom surface of the trench, forming a spacer on the gate oxide film on the bottom of the trench such that a first side of the spacer is adjacent a side surface of the trench and such that a second side of the spacer is exposed, forming a gate on the gate oxide film on the bottom of the trench such that a first side of the gate is adjacent the second side of the spacer and a second side of the gate is exposed, forming a second doped region in the top surface of the substrate adjacent the first side of the spacer, forming a first doped region on the bottom surface of the trench adjacent the second side of the gate, removing the spacer to create a recess, and forming a third doped region on the bottom surface of the recess between the gate and the second doped region.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

The invention will be described in detail with reference to the following drawings in which like reference numerals refer to like elements wherein:

FIGS. 5A to 5E are cross-sectional views for illustrating a method of manufacturing the semiconductor device shown in FIG. 3.

DETAILED DESCRIPTION OF PREFERRED EMBODIMENTS

Figure 1:
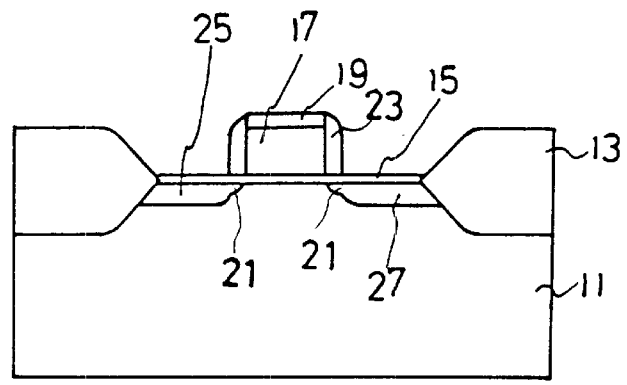
FIG. 1 is a cross-sectional view of a related art semiconductor device.
Figure 2:
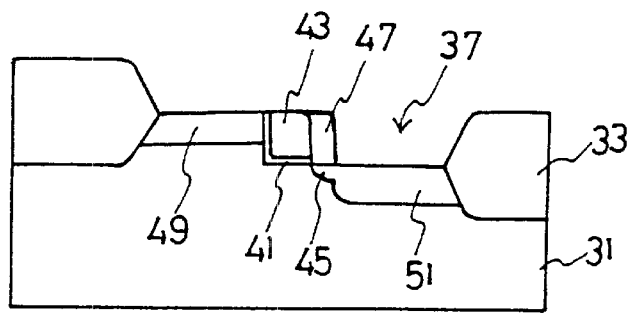
FIG. 2 is a cross-sectional view of a semiconductor device, according to one embodiment of the present invention.

FIG. 2 is a cross-sectional view of a semiconductor device, according to one embodiment of the present invention, in which a device isolation region 33 for defining an active region of the device is formed on a predetermined part of the surface of a P-type semiconductor substrate 31. By a dry etching process, such as reactive ion etching (hereinafter, referred to as "RIE") or plasma etching, a trench or a recess 37 having a depth of about 500~2000 Å is formed on a predetermined part of one side of the active region. This embodiment illustrates a trench, however, as can be appreciated, any type of recesses can be also used to achieve the present invention.

A gate 43 having a sidewall shape is formed on one side and a predetermined part of the lower surface or base of trench or recess 37, with a gate oxide film 41 imposed therebetween. Gate 43 is formed so that the first side thereof is in contact with gate oxide film 41, by depositing an impurity-doped polycrystalline silicon material on the surface of both substrate 31 and trench or recess 37 and then etching back impurity-doped polycrystalline silicon material by a RIE method. Accordingly, gate 43 can be formed so as to have a narrower width than that could be formed by a photolithographic method. The width is about 300~2000 Å. Then, on the second exposed side of gate 43, a sidewall 47 consisting of an insulating material, such as a silicon oxide, is formed to a width of about 300~1000 Å.

Using gate 43 as a mask, a low concentration region 45 doped with a low concentration by an N-type impurity, such as arsenic (As) or phosphorus (P) of a conductivity type opposite to that of semiconductor substrate 31, is formed in the lower surface of trench or recess 37 between the side of trench or recess 37 and the first side of gate 43. Low concentration region 45 serve to form the LDD structure and formed so as to be partially overlapped by gate 43.

Then, in predetermined portions of a part of the active region where trench 37 is not formed, and in a part where trench or recess 37 is formed, source region 49 and drain region 51, each doped with a high concentration of an N-type impurity, are formed, respectively. Source and drain regions 49 and 51 are formed using gate 43 and sidewall 47 as a mask. Drain region 51, formed in the lower surface of trench or recess 37 in the direction of the first side of gate 43, is not overlapped by gate 43, and is partially overlapped by low concentration region 45.

The region between source region 49 (formed in the part of the active region where trench or recess 37 is not formed, and which is located at predetermined part in the direction of the second side of gate 43) and low concentration region 45 forms a channel region. Since source region 49 is shallower than the lower surface of trench or recess 37, even if the width of gate 43 is narrow, the channel makes a right angle around a corner of gate 43 and the channel has a longer width than the width of gate 43. Thus, even if the bias of drain region 51 increases, the increase in a depletion region is prevented, thereby decreasing the occurrence of the DIBL phenomenon, in turn reducing the potential barrier of source region 49.

Figure 3:
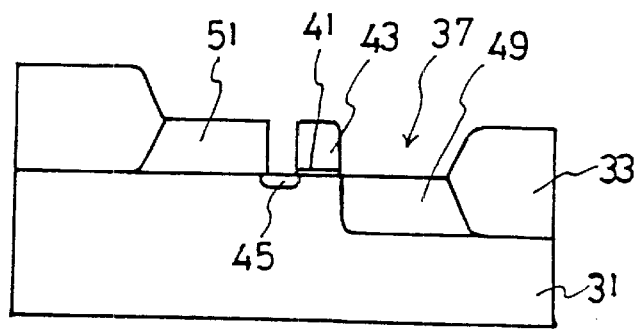
FIG. 3 is a cross-sectional view of a semiconductor device, according to another embodiment of the present invention.

FIG. 3 is a cross-sectional view of a semiconductor device, according to another embodiment of the present invention, in which a device isolation region 33 for defining an active region of a device is formed on a predetermined part of the surface of a P-type semiconductor substrate 31. By a dry etching process such as RIE or plasma etching, a trench or recess 37 having a depth of about 500~2000 Å is formed on a predetermined part of one side of the active region.

A gate 43 having first side and second sides is formed on a predetermined part of the lower surface of trench or recess 37, with a gate oxide film 41 imposed between the lower surface of the trench or recess and gate 43. Gate 43 is formed by depositing an impurity-doped polycrystalline silicon material on the lower surface of the trench or recess 37 including a sidewall (not shown) formed on the side of trench or recess 37, and then etching back the impurity-doped polycrystalline silicon material by a RIE method, and removing the sidewall. Accordingly, gate 43 can be formed so as to have a narrower width of about 300~2000 Å than that could formed by a photolithographic method.

Using gate 43 as a mask, a low concentration region 45, doped with a low concentration of an N-type impurity, such As or P of a conductivity type opposite that of semiconductor substrate 31, is formed in the lower surface of trench or recess 37 between the side of trench or recess 37 and the first side of gate 43. Low concentration region 45 serves to form the LDD structure and is formed so as to be partially overlapped with gate 43.

Then, in the lower surface of trench 37 where low concentration region 45 is not formed, i.e., in the direction of the second side of gate 43, source region 49 is formed. While in the part where no trench or recess 37 is formed, i.e., in the direction of the first side of gate 43, drain region 51 is formed. Both source and drain regions 49 and 51 are doped with a high concentration of an N-type impurity. Drain region 51, in the direction of the first side of gate 43, is formed to the lower surface of trench or recess 37 and is partially overlapped with low concentration region 45. Thus, drain region 51 is electrically connected therewith. The region between source region 49, in the direction of the second side of gate 43, and low concentration region 45 forms a channel region.

According to the embodiment illustrated in FIG. 3, low concentration region 45 is not formed between the channel region and source region 49, but between the channel region and drain region 51. Thus, the source resistance of the device can be decreased.

Figure 4A:
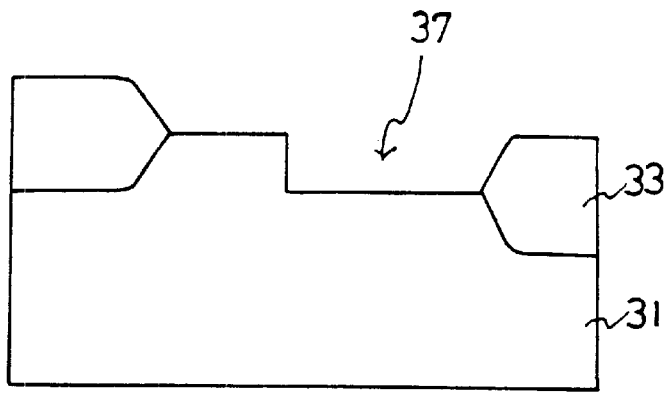
FIGS. 4A to 4D are cross-sectional views illustrating a method of manufacturing the semiconductor device shown in FIG. 2.

FIGS. 4A to 4D are cross-sectional views illustrating a method of manufacturing the semiconductor device shown in FIG. 2. Referring to FIG. 4A, a device isolation region 33 is formed to a thickness of about 3000~5000 Å on a predetermined part of the surface of a P-type semiconductor substrate 31, thereby defining an active region of the device. Through a photolithographic method, including a dry etching process such as RIE or plasma etching, a trench or recess 37 having a depth of about 500~2000 Å is formed in a predetermined part of one side of the active region of semiconductor substrate 31. As can be appreciated, semiconductor substrate 31 may be of the P-type or the N-type conductivity A P-type semiconductor substrate is chosen to explain the present invention. In the above case, trench or recess 37 is formed after forming device isolation region 33. However, as can be appreciated, device isolation region 33 may instead be formed after trench or recess 37 is formed.

Figure 4B:
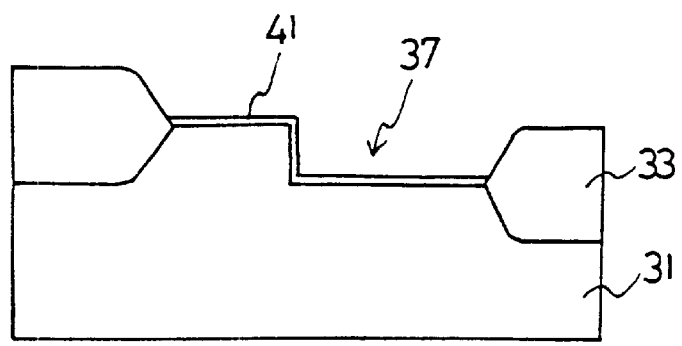

Referring to FIG. 4B, in the surface of semiconductor substrate 31, including the inner surface of trench or recess 37, a P-type impurity of the same conductivity type as that of semiconductor substrate 31, e.g., boron (B) or $BF_2$, is ion-implanted. This latter step is performed in order to control the threshold voltage and to suppress the punchthrough. The ion implantation step is performed at a predetermined tilt angle such that the ion is implanted in the side or wall of trench or recess 37, as well as in the perpendicular direction with respect to semiconductor substrate 31. Then, the surface of semiconductor substrate 31, including the inner surfaces of trench or recess 37, is thermally oxidized to form a gate oxide film 41 having a thickness of about 30~100 Å.

Figure 4C:
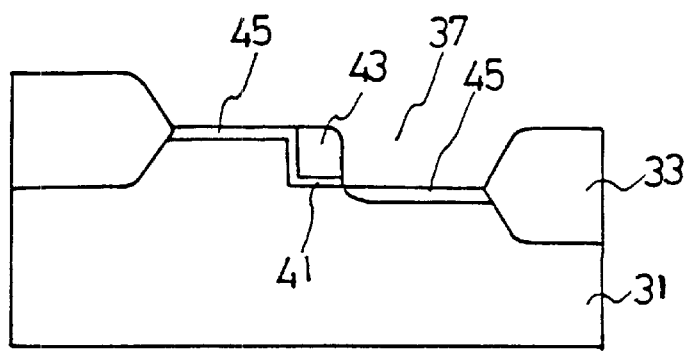

Referring to FIG. 4C, through a CVD method, a polycrystalline silicon material is deposited on the upper part of device isolation region 33 and gate oxide film 41. Then, the polycrystalline silicon material is etched back by a RIE method to form a gate 43 having a sidewall shape and having a width of about 300~2000 Å, so that the first side of the gate is in contact with the side of trench or recess 37 and the second side of the gate is exposed. At this time, gate oxide film 41, which is not in contact with gate 43, is also removed. Since gate 43 is formed by an etching-back method, it can be formed more narrowly than would be possible with a common photolithographic method.

Then, using gate 43 as a mask, an N-type impurity having a conductivity type opposite to that of semiconductor substrate 31, e.g., arsenic (As) or phosphorus (P), is ion-implanted at a concentration of about $1.0\times10^{13}$~$1.0\times10^{15}$/ $cm^2$, thereby forming low concentration regions 45 in semiconductor substrate 31 on both sides of gate 43. Low concentration region 45 serves to form the LDD structure. The impurity ion is implanted perpendicularly to semiconductor substrate 31, and formed so as to be partially overlapped with gate 43.

Figure 4D:
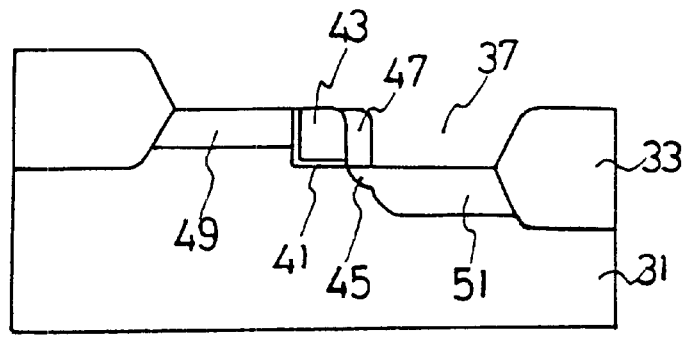

Referring to FIG. 4D, through a CVD method, an insulating material such as a silicon oxide is thickly deposited over the entire surface of the resultant structure and etched back by a RIE method, thereby forming a sidewall 47 having a width of about 300~1000 Å that is in contact with the exposed second side of gate 43. Then, using gate 43 and sidewall 47 as a mask, an N-type impurity of the conductivity type opposite to that of semiconductor substrate 31, e.g., arsenic (As), is ion-implanted at a concentration of about $1.0\times10^{14}$~$5.0\times10^{15}$/$cm^2$, thereby forming source and drain regions 49 and 51 in semiconductor substrate 31. Since the impurity ion for forming source and drain regions 49 and 51 are implanted perpendicularly to semiconductor substrate 31, low concentration region 45 making the LDD structure is completely overlapped by source region 49 in the direction of the first side of gate 43, and overlapped by drain region 51 in the direction of the second side of gate 43.

Accordingly, low concentration region 45 does not exist between channel region and source region 49 and exists only between channel region and drain region 51, thereby decreasing the source resistance. The channel region is defined by the formation of source and drain regions 49 and 51. The channel region is formed also on the side of trench or recess 37 along the junction depth of source region 49. Accordingly, source region 49 is formed so as to be higher than the lower surface of trench or recess 37, and the channel region makes a right angle trench or recess 37. Thus, the channel has a width longer than gate 43, and the increase in the depletion region is prevented even if the bias of drain region 51 increases. Therefore, the occurrence of the DIBL phenomenon, which tends to reduce the potential barrier of source region 49, can be decreased.

Figure 5A:
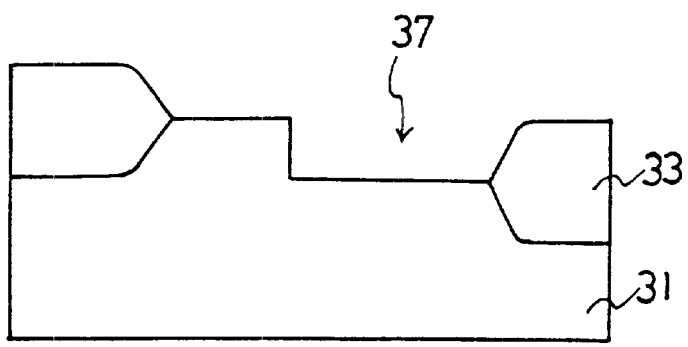

FIGS. 5A to 5E are cross-sectional views illustrating a method of manufacturing the semiconductor device of FIG. 3. Referring to FIG. 5A, a device isolation region 33 is formed to a thickness of about 3000~5000 Å on a predetermined part of the surface of a P-type semiconductor substrate 31, thereby defining an active region of the device. Through a photolithographic method, including a dry etching process such as RIE or plasma etching, a trench or recess 37 having a depth of about 500~2000 Å is formed in a predetermined part of one side of the active region of semiconductor substrate 31. Semiconductor substrate 31 may be of the P-type or the N-type conductivity. In the above case, trench or recess 37 is formed after forming device isolation region 33. However, as can be appreciated, device isolation region 33 may be formed after trench or recess 37 is formed.

Figure 5B:
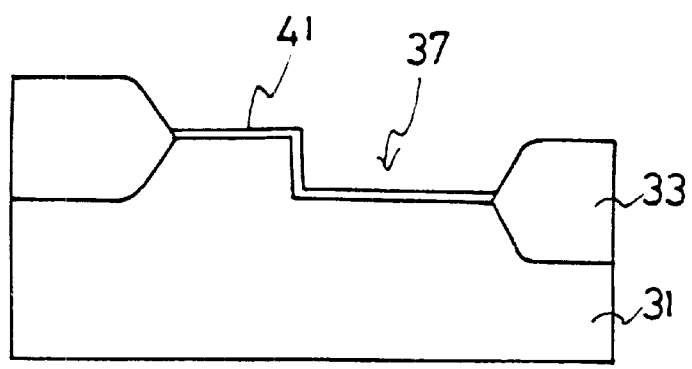

Referring to FIG. 5B, in the surface of semiconductor substrate 31, including the inner surface of trench or recess 37, a P-type impurity of the same conductivity type as that of semiconductor substrate 31, e.g., boron (B) or $BF_2$, is ion-implanted in a perpendicular direction. This latter step is performed in order to control the threshold voltage and to suppress punchthrough. Then, the surface of semiconductor substrate 31, including the inner surface of trench or recess 37, is thermally oxidized to form a gate oxide film 41 having a thickness of about 30~100 Å.

Figure 5C:
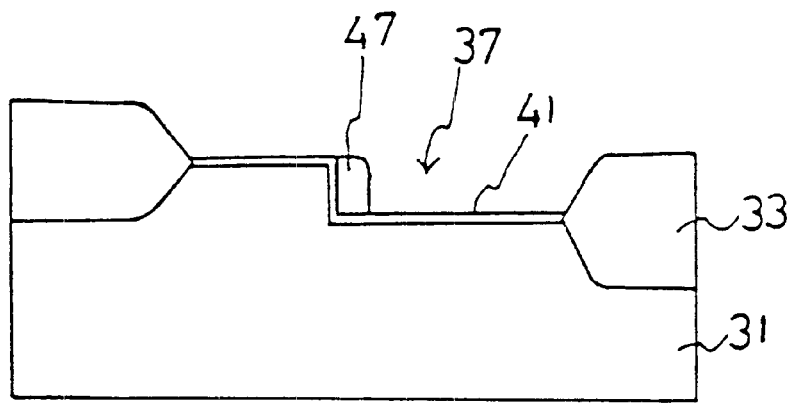

Referring to FIG. 5C, through a CVD method, an insulating material such as a silicon oxide is thickly deposited on the upper part of device isolation region 33 and gate oxide film 41, and the insulating material is etched back by a RIE method, thereby forming a sidewall 47 having a width of about 300~1000 Å on the side of trench or recess 37. Sidewall 47 is formed such that the first side thereof is in contact with gate oxide film 41 and therefore not exposed, whereas the second side of sidewall 47 is exposed.

Referring to FIG. 5D, an impurity-doped polycrystalline silicon material is deposited on the entire surface of the resultant structure and etched back by a RIE method, thereby forming a gate 43 having a width of about 300~2000 Å such that a first side thereof is in contact with the second side of sidewall 47 and the second side of the gate is exposed. Since gate 43 is formed by an etching-back method, it can be formed shorter or narrower than would be possible with a common photolithographic method.

Then, using gate 43 and sidewall 47 as a mask, an N-type impurity of a conductivity type opposite to that of semiconductor substrate 31, e.g., arsenic (As), is ion-implanted at a concentration of about $1.0\times10^{14}$~$5.0\times10^{15}$/cm$^2$, thereby forming source and drain regions 49 and 51, respectively, in semiconductor substrate 31. Drain region 51, which is formed in a part of semiconductor substrate 31 where trench or recess 37 is not formed, i.e., in the direction of the first side of sidewall 47, should be formed to the depth of the lower surface of trench or recess 37.

Figure 5E:
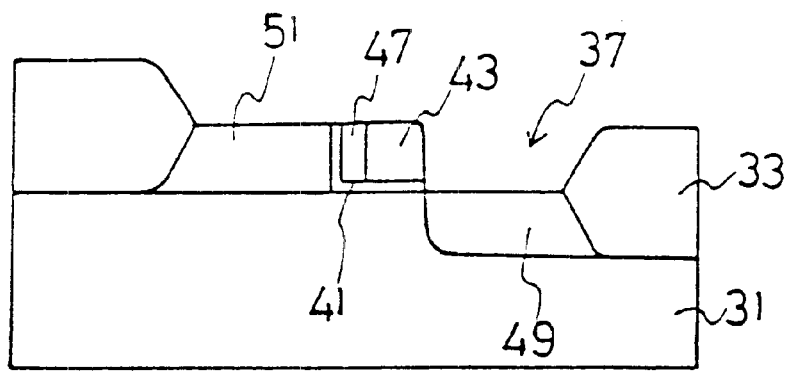
Figure 5E:
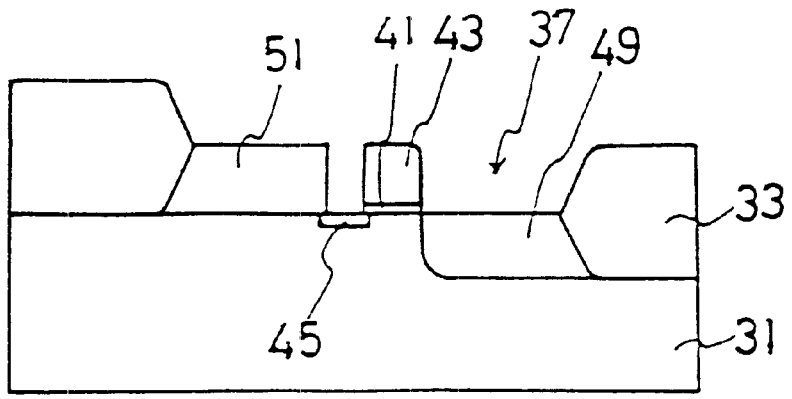

Referring to FIG. 5E, sidewall 47 and gate oxide film 41 are removed by a wet etching process. Then, using gate 43 as a mask, an N-type impurity of the conductivity type opposite to that of semiconductor substrate 31, e.g., arsenic (As) or phosphorus (P), is ion-implanted at a concentration of about $1.0\times10^{13}$~$1.0\times10^{15}$/cm$^2$, thereby forming a low concentration region 45 between the first side of gate 43 and drain region 51. Low concentration region 45 serves to form the LDD structure, and is not formed between gate 43 and source region 49. Rather, low concentration region 45 is formed only between gate 43 and drain region 51 so as to form a junction with drain region 51, thereby decreasing the source resistance of the semiconductor device.

In the above embodiments, a trench or a recess is formed in a predetermined part of a semiconductor substrate. Then, on the side of the trench or recess, a gate with a sidewall is formed by the respective etching-back processes. Using the gate as a mask, a low concentration region for the LDD structure is formed. Using the gate and sidewall as a mask, a source region and a drain region are formed. Thus, the channel region makes a right angle with the trench or recess, and the channel region is bent. Further, the channel region is made to be formed so as to be longer than the width of the gate. Since the low concentration region for the LDD structure is formed only in the drain region, the source resistance can be decreased, and a gate with a narrow width can be easily formed. Further, even if the channel length is short, the occurrence of the DIBL phenomenon can be suppressed.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of manufacturing a semiconductor device, comprising the steps of:

forming a trench in a top surface of a semiconductor substrate, wherein said trench comprises at least one vertical wall;

implanting ions into said top surface of said semiconductor substrate and into a bottom surface of said trench;

forming an oxide film on said top surface of said semiconductor substrate, on said at least one vertical wall and on said bottom surface of said trench;

forming an oxide sidewall in said trench in contact with said oxide film on said at least one vertical wall and partially covering said bottom surface of said trench;

forming a gate in said trench in contact with said oxide sidewall and partially covering said bottom surface of said trench;

forming a first doped region in said top surface of said semiconductor substrate;

forming a second doped region in said bottom surface of said trench;

forming a recess by removing at least said oxide film on said at least one vertical wall and by removing at least said oxide sidewall; and forming a third doped region in the bottom of said recess.

2. The method of claim 1, wherein the step of forming said gate comprises:

depositing an impurity-doped polycrystalline silicon material onto said oxide film on said top surface of said semiconductor substrate, onto said oxide sidewall, and onto said bottom surface of said trench; and selectively removing portions of said impurity-doped polycrystalline silicon material such that said gate resides within said trench in contact with said oxide sidewall and partially covers said bottom surface of said trench.

3. The method of claim 2, wherein step of selectively removing said impurity-doped polycrystalline silicon material comprises a RIE (reactive ion etching) method.

4. The method of claim 1, wherein the step of forming a gate comprises forming the gate such that a top surface of said gate is at approximately a same height as the top surface of said semiconductor substrate.

5. The method of claim 1, wherein the step of forming said first doped region comprises forming said first doped region to approximately a depth of said bottom surface of said trench.

6. The method of claim 1, wherein the step of forming said third doped region comprises forming said third doped region between said first doped region and said gate.

7. The method of claim 1, wherein a channel region is formed between said first doped region and said second doped region, and said channel region is longer than a width of said gate.

8. A method of manufacturing a semiconductor device, comprising the steps of:

forming a trench in a top surface of a semiconductor substrate with at least one sidewall;

forming a gate oxide film over the semiconductor substrate so that the gate oxide film covers at least a portion of a bottom surface of the trench and covers the at least one sidewall of the trench;

forming a gate on the gate oxide film on the bottom surface of the trench such that a first side of the gate is exposed and a second side of the gate contacts the gate oxide film covering the at least one sidewall of the trench and such that a top surface of the gate is at approximately a same height as the top surface of the semiconductor substrate;

forming a first doped region having a first dopant concentration in the top surface of the substrate;

forming a second doped region having the first dopant concentration on the bottom surface of the trench adjacent the exposed side of the gate;

forming a recess between said gate and said at least one sidewall by removing at least said gate oxide film; and forming a third doped region at the bottom of said recess having a second dopant concentration.

9. The method of claim 8, wherein the step of forming said gate comprises depositing an impurity-doped polycrystalline silicon material onto said top surface of said semiconductor substrate, and onto said bottom surface of said trench, and etching-back said impurity-doped polycrystalline silicon material.

10. The method of claim 8, wherein the step of forming said first doped region comprises forming said first doped region to approximately a depth of said bottom surface of said trench.

11. The method of claim 8, wherein the step of forming said third doped region comprises forming said third doped region between said first doped region and said gate.

12. The method of claim 8, wherein a channel region is formed between said first doped region and said second doped region, and said channel region is longer than a width of said gate.

13. A method of manufacturing a semiconductor device, comprising the steps of:

forming a trench in a top surface of a semiconductor substrate;

forming a gate oxide film on the surface of the semiconductor substrate so that the gate oxide film covers at least a portion of a bottom surface of the trench;

forming a spacer on the gate oxide film on the bottom of the trench such that a first side of the spacer is adjacent a side surface of the trench and such that a second side of the spacer is exposed;

forming a gate on the gate oxide film on the bottom surface of the trench such that a first side of the gate is adjacent the second side of said spacer and a second side of the gate is exposed;

forming a first doped region in the top surface of the substrate adjacent the first side of the spacer;

forming a second doped region on the bottom surface of the trench adjacent the second side of the gate;

removing the spacer to create a recess; and forming a third doped region on the bottom surface of the recess between the gate and the first doped region.

14. The method of claim 13, wherein the step of forming said gate comprises:

depositing an impurity-doped polycrystalline silicon material onto said top surface of said semiconductor substrate, onto said spacer, and onto said bottom surface of said trench; and etching-back said impurity-doped polycrystalline silicon material such that said gate is formed in the trench and adjacent the spacer.

15. The method of claim 13, wherein said etching-back comprises a RIE method.

16. The method of claim 13, wherein the step of forming a gate comprises forming the gate such that a top surface of said gate is at approximately a same height as the top surface of said semiconductor substrate.

17. The method of claim 13, wherein the step of forming said first doped region comprises forming said first doped region to approximately a depth of said bottom surface of said trench.

18. The method of claim 13, wherein a channel region is formed between said first doped region and said second doped region, and said channel region is longer than a width of said gate.

* * * * *